(12) United States Patent
Jeong et al.

(10) Patent No.: US 7,727,823 B2
(45) Date of Patent: Jun. 1, 2010

(54) FLAT PANEL DISPLAY AND METHOD FOR DRIVING THE SAME

(75) Inventors: Jae Kyeong Jeong, Yongin (KR); Jae Bon Koo, Yongin (KR); Hyun Soo Shin, Yongin (KR); Se Yeoul Kwon, Yongin (KR); Yeon Gon Mo, Yongin (KR); Keum Nam Kim, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/477,101

(22) Filed: Jun. 27, 2006

(65) Prior Publication Data

US 2006/0289868 A1 Dec. 28, 2006

(30) Foreign Application Priority Data

Jun. 28, 2005 (KR) ................ 10-2005-0056540
Jul. 14, 2005 (KR) ................ 10-2005-0063846

(51) Int. Cl.
*H01L 21/00* (2006.01)
*H01L 21/84* (2006.01)

(52) U.S. Cl. ........................... 438/149; 257/66
(58) Field of Classification Search ............ 257/66, 257/659, 660
See application file for complete search history.

(56) References Cited

U.S. PATENT DOCUMENTS

| 6,194,282 | B1 * | 2/2001 | Niimi et al. ............ 438/404 |
| 6,358,778 | B1 * | 3/2002 | Shinohara ............ 438/123 |
| 6,537,890 | B2 | 3/2003 | Joo et al. |
| 6,556,257 | B2 | 4/2003 | Ino |
| 6,642,092 | B1 | 11/2003 | Voutsas et al. |
| 6,765,249 | B2 | 7/2004 | Voutsas et al. |
| 2001/0054714 | A1 * | 12/2001 | Yamazaki ............ 257/72 |
| 2002/0063515 | A1 * | 5/2002 | Goto ............ 313/500 |

(Continued)

FOREIGN PATENT DOCUMENTS

JP 09-179106 7/1997

(Continued)

OTHER PUBLICATIONS

Patent Abstract of Japan, Publication 2003-280034, Published Oct. 2, 2003, in the name of Amano.

(Continued)

*Primary Examiner*—Kenneth A Parker
*Assistant Examiner*—Anthony Ho
(74) *Attorney, Agent, or Firm*—Christie, Parker & Hale, LLP

(57) ABSTRACT

A flat panel display for preventing a thin film transistor from deteriorating due to voltage, static electricity, and external force, accidentally applied to a substrate, and a method for driving the same. The flat panel display includes a conductive substrate, at least one insulating layer formed on the conductive substrate, at least one thin film transistor formed on the conductive substrate, and a ground formed in a region of the conductive substrate to ground the conductive substrate. Thus, the deterioration of the thin film transistor that would be generated by voltage, static electricity, or external force, accidentally applied to the conductive substrate can be substantially prevented and the performance of the display is enhanced.

8 Claims, 9 Drawing Sheets

U.S. PATENT DOCUMENTS

| | | |
|---|---|---|
| 2003/0148567 A1 | 8/2003 | Joo et al. |
| 2004/0129960 A1 | 7/2004 | Maruyama et al. |
| 2004/0212012 A1 | 10/2004 | Yamazaki et al. |
| 2006/0202209 A1 * | 9/2006 | Kelman et al. ............... 257/77 |

FOREIGN PATENT DOCUMENTS

| | | |
|---|---|---|
| JP | 10-98190 | 4/1998 |
| JP | 10-161095 | 6/1998 |
| JP | 2000-196102 A | 7/2000 |
| JP | 2003-280034 | 10/2003 |
| JP | 2004-006870 A | 1/2004 |
| JP | 2004-109975 | 4/2004 |
| JP | 2005-292579 A | 10/2005 |
| KR | 10-0285303 | 1/2001 |
| KR | 2002-0021546 | 3/2002 |
| KR | 10-2004-0105359 | 12/2004 |
| WO | WO 02/084739 A1 | 10/2002 |

OTHER PUBLICATIONS

Korean Patent Abstracts, Publication 1020020021546 A, Published Mar. 21, 2002, in the name of Joo, et al.

Korean Patent Abstracts, Publication 1020040105359 A, Published Dec. 16, 2004, in the name of Kim, et al.

JPO Office Action for corresponding Japanese Patent Application No. 2005-339510, dated Dec. 2, 2008, listing cited references in this IDS.

* cited by examiner

FLAT PANEL DISPLAY AND METHOD FOR DRIVING THE SAME

CROSS-REFERENCE TO RELATED APPLICATIONS

This application claims priority to and the benefit of Korean Patent Application Nos. 10-2005-0056540, filed on Jun. 28, 2005, and 10-2005-0063846, filed on Jul. 14, 2005, in the Korean Intellectual Property Office, the entire contents of both of which are incorporated herein by reference.

BACKGROUND

1. Field of the Invention

The present invention relates to a flat panel display and a method for driving the same, and more particularly, to a flat panel display for preventing a thin film transistor from deteriorating due to voltage, static electricity, and external force, accidentally applied to a substrate, and a method for driving the same.

2. Discussion of Related Art

Generally, in order to implement a thin film transistor on a conductive thin film formed by using a conductive substrate composed of stainless steel (SUS) or titanium (Ti), a buffer layer is needed between the conductive thin film and the thin film transistor to function as an insulating layer. As such, the thin film transistor formed on the conductive thin film including the buffer layer has electrical and structural characteristics similar to silicon on insulator (SOI) transistor. In the thin film transistor having the buffer layer, a semiconductor layer that forms the thin film transistor can be made of low temperature polysilicon (LTPS), in which an amorphous silicon layer is heated and crystallized at low temperature or is crystallized by excimer laser annealing (ELA).

However, in the thin film transistors as described above, when an external force is applied to the conductive substrate, the thin film transistor including the semiconductor layer formed by the low temperature polysilicon may be deteriorated. In more detail, when a tensile stress is applied to the conductive substrate, the drain current of the thin film transistor is increased, and when compressive stress is applied to the conductive substrate, the drain current of the thin film transistor is decreased.

As such, due to the tensile stress or compressive stress generated when bending the conductive substrate, the drain current of the thin film transistor varies so that characteristics of a flat panel display using the thin film transistor, leakage current and mobility, and brightness and contrast of image pixels are also changed. Thus, an image of the flat panel display is deteriorated.

Moreover, in the structure of the conventional thin film transistor, since when an expected voltage is applied to the conductive substrate and/or unexpected electric charges are accumulated on the conductive substrate due to static electricity, the threshold voltage of the thin film transistor becomes different from a reference threshold voltage, thereby making circuit tuning difficult.

FIG. 1 illustrates changes in characteristic of drain current of a conventional thin film transistor due to application of back bias.

As shown in FIG. 1, the X-axis represents gatebias applied to the thin film transistor, and the Y-axis represents change of the drain current due to the back bias applied to the thin film transistor. As illustrated in this graph, it can be derived that when the back bias voltage is increased, a shift of threshold voltage is increased.

As such, when the threshold voltage of a thin film transistor substrate is changed into a value different from a reference threshold voltage, color coordinates representing every color displayed on a display using the thin film transistor with X- and Y-values, gray scale, and contrast may be changed.

SUMMARY OF THE INVENTION

Accordingly, an embodiment of the present invention provides a flat panel display for preventing a thin film transistor from deteriorating due to external force accidentally applied to a conductive substrate and for substantially preventing a threshold voltage from changing due to voltage, static electricity, and/or the like, accidentally applied to the conductive substrate, and a method for driving the same.

An embodiment of the present invention provides a flat panel display including a conductive substrate, at least one insulating layer formed on the conductive substrate, at least one thin film transistor formed on the conductive substrate, and a ground formed in a region of the conductive substrate to ground the conductive substrate.

An embodiment of the present invention provides a flat panel display including a conductive substrate, at least one thin film transistor formed on the conductive substrate, at least one insulating layer formed on the conductive substrate, a substrate exposing part for exposing at least one region of the conductive substrate, and a system controller connected to the substrate exposing part to apply back bias voltage to the conductive substrate.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
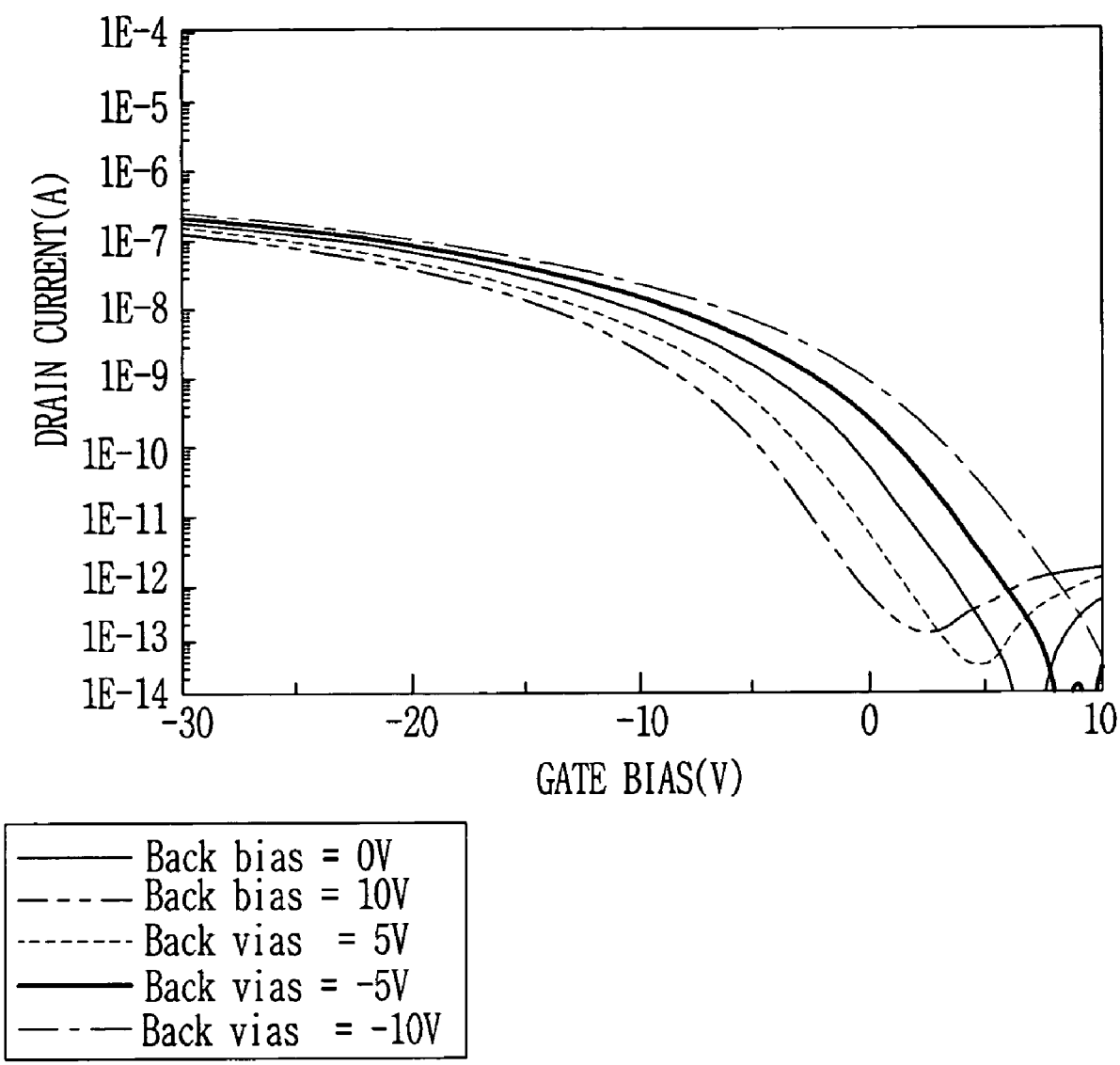
FIG. 1 illustrates changes in characteristic of drain current of a conventional thin film transistor due to application of back-bias.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements. Here, when a first element is connected to/with a second element, the first element may not only be directly connected to/with the second element but also be indirectly connected to/with the second element via a third element. Also, when a first element is on a second element, the first element may not only be directly on the second element but may also be indirectly on the second element via a third element.

Figure 2:
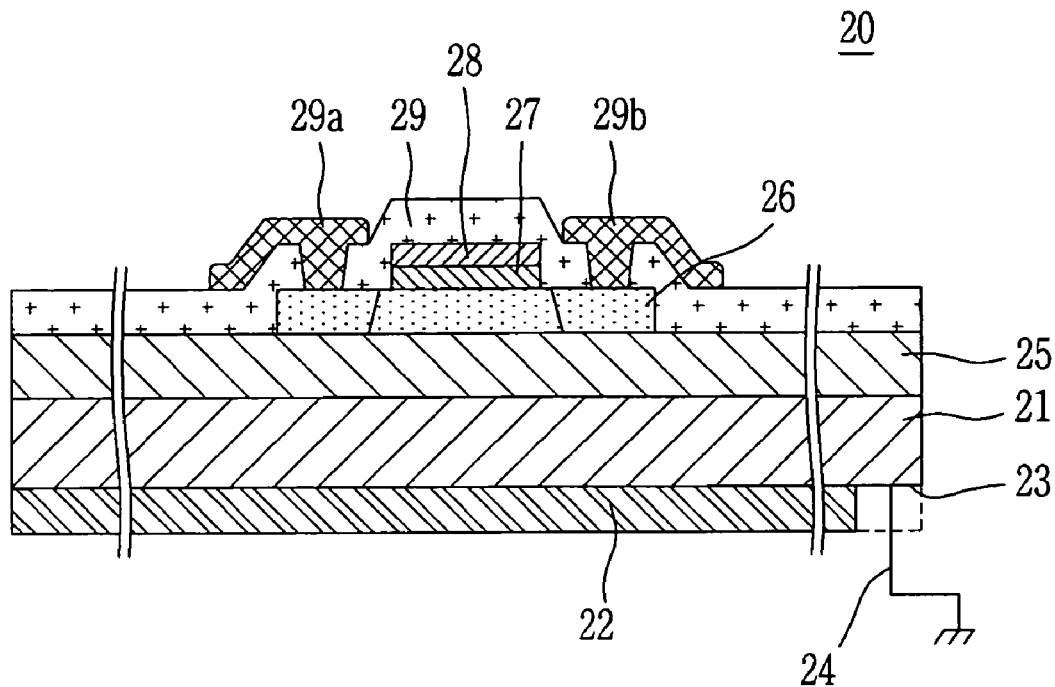
FIG. 2 is a schematic side sectional view of a flat panel display according to a first embodiment of the present invention.

FIG. 2 is a schematic side sectional view of a flat panel display 20 according to a first embodiment of the present invention.

As shown in FIG. 2, the flat panel display 20 includes a conductive substrate 21, a first insulating layer 25, a semiconductor layer 26, a second insulating layer 27, a gate electrode 28, a third insulating layer 29, and source and drain electrodes 29a and 29b. Moreover, the flat panel display 20 further includes a fourth insulating layer 22 formed at the lower surface of the conductive substrate 21, a ground 23 formed by removing a region of at least one of the first, third, and fourth insulating layers 25, 29, and 22 to partially expose the conductive substrate 21, and a metal wire 24.

In more detail, the first insulating layer 25 is formed on the conductive layer 21 and serves as a buffer layer. In this embodiment, the conductive substrate 21 is formed with stainless steel (SUS) or titanium (Ti); and, in a more specific embodiment, the conductive substrate 21 is formed of a flexible metal foil.

The semiconductor layer 26 is formed on the first insulating layer 25 and uses low temperature polysilicon (LTPS) in which amorphous silicon vapor-deposited on the conductive substrate 21 is crystallized by laser. The semiconductor layer 26 may be made of silicon and/or organic material. On the semiconductor layer 26, the second insulating layer 27 is formed, and on the second insulating layer 27, the gate electrode 28 is formed. In this embodiment, the second insulating layer 27 and the gate electrode 28 may be simultaneously patterned, and as shown in FIG. 2, the gate electrode 28 and the second insulating layer 27 may be formed on the upper side of a channel region of the semiconductor layer 26.

The third insulating layer 29 is formed on the first insulating layer 25 and the gate electrode 28, and on the third insulating layer 29, contact holes are formed. The source and drain electrodes 29a and 29b are formed on the third insulating layer 29, and electrically connected to the semiconductor layer 26 via the contact holes formed in the third insulating layer 29. The fourth insulating layer 22 is formed on the lower surface of the conductive substrate 21 and substantially prevents noise and impurities applied from the exterior from entering the conductive substrate 21. The first to fourth insulating layers 25, 27, 29, and 22 are oxide films or nitride films, but are not limited to them.

The ground 23 is formed by removing a region of the fourth insulating layer 22 formed on the lower surface of the conductive substrate 21, but its formation position is not limited to the position shown in FIG. 2. Moreover, the metal wire 24 is connected to the ground 23. By connecting the metal wire 24 to the ground 23, electric charges generated due to unexpected voltage and/or static electricity applied to the conductive substrate 21 can be discharged to the outside. The metal wire 24 is made of a conductive alloy such as gold (Au), silver (Ag), aluminum (Al), copper (Cu), or other conductive alloys. The metal wire 24 is connected to the ground 23 by various connection methods (for example, by soldering). Moreover, the metal wire 24 has a strap shape having a predetermined width, or a line shape, but is not limited to these shapes.

Figure 3:
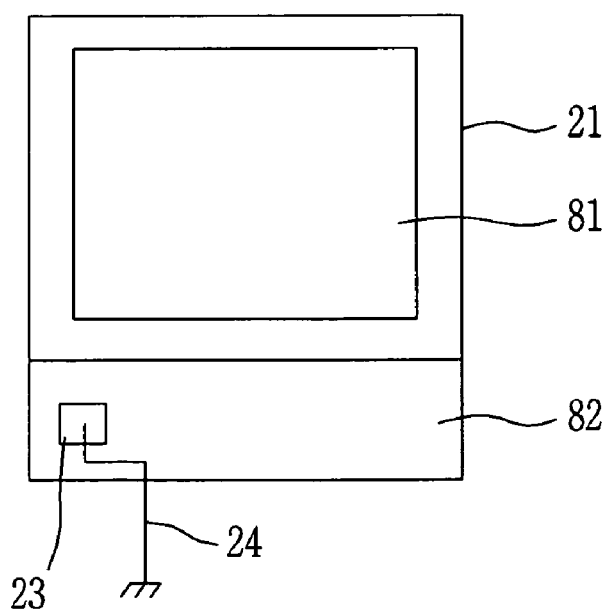
FIG. 3 is a plan view illustrating a position where a ground in FIG. 1 can be formed.
Figure 4:
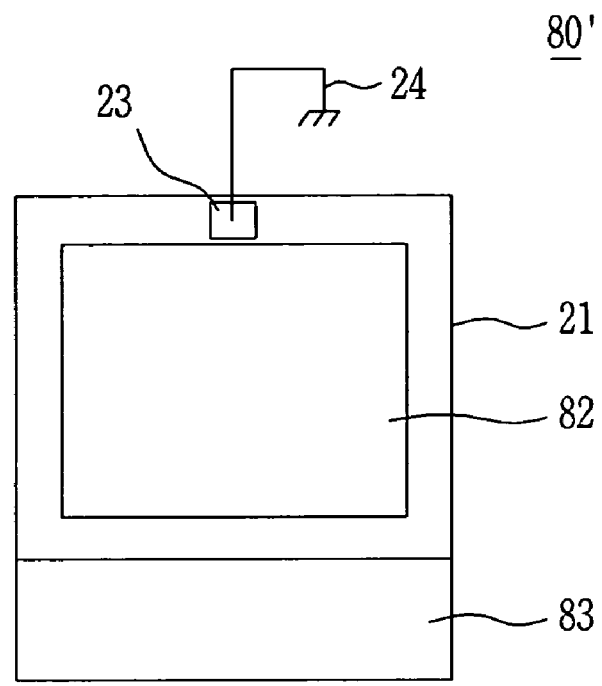
FIG. 4 is another plan view illustrating another position where the ground in FIG. 1 can be formed.

FIG. 3 is a plan view illustrating a position where the ground 23 in FIG. 2 can be formed, and FIG. 4 is another plan view illustrating a position where the ground 23 in FIG. 2 can be formed.

As shown in FIGS. 3 and 4, an organic light emitting display 80 or 80' includes an image displaying region 81 and a pad 82 formed on the conductive substrate 21, and a ground 23. In the image displaying region 81, thin film transistors (not shown) and light emitting devices (not shown) are formed, and in the pad 82, terminals (not shown) are formed. In one embodiment, at least one of the light emitting devices is an organic light emitting device.

As shown in FIG. 3, the ground 23 is formed in a corner of the conductive substrate 21, and in more detail, on the pad 82. The metal wire 24 is connected to the ground 23, and the metal wire 24 discharges charges generated by unexpected voltage or static electricity on the conductive substrate 21 to the outside.

Although, in the above embodiment shown in FIG. 3, the ground 23 is formed in the corner of the conductive substrate 21 the position where the ground 23 is formed is not limited to this, but the ground 23 should be formed in a position where light emission efficiency of the organic light emitting devices formed in the image displaying region 81 is not deteriorated.

As shown in FIG. 4, the ground 23 can also be formed in a central region of an end of the conductive substrate 21, and in more detail, in the upper central region of the image displaying region 81. Like the above description for FIG. 3, the ground 23 is connected to the metal wire 24, and the metal wire 24 discharges charges generated by unexpected voltage or static electricity on the conductive substrate 21 to the outside.

Figure 5:
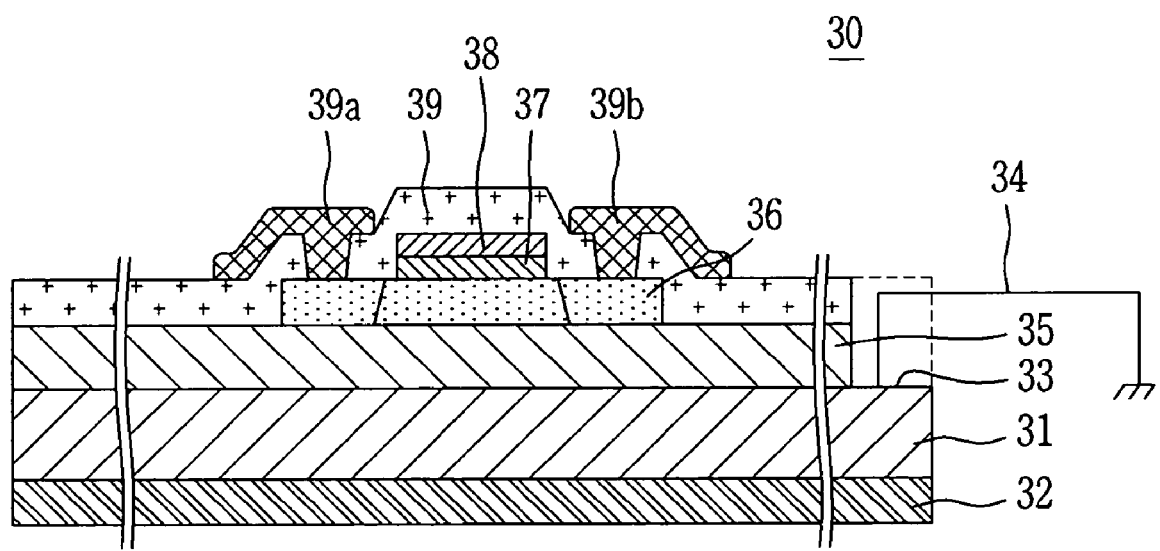
FIG. 5 is a schematic side sectional view illustrating a flat panel display according to a second embodiment of the present invention.

FIG. 5 is a schematic side sectional view illustrating a flat panel display 30 according to a second embodiment of the present invention.

As shown in FIG. 5, the flat panel display 30 includes a conductive substrate 31, a first insulating layer 35, a semiconductor layer 36, a second insulating layer 37, a gate electrode 38, a third insulating layer 39, and source and drain electrodes 39a and 39b. Moreover, the flat panel display 30 further includes a fourth insulating layer 32 formed on the lower surface of the conductive substrate 31, a ground 33 for at least partially grounding the conductive substrate 31, and a metal wire 34. To avoid duplicate description, the detailed description of the first insulating layer 35, the semiconductor layer 36, the second insulating layer 37, the gate electrode 38, the third insulating layer 39, the source and drain electrodes 39a and 39b, the fourth insulating layer 32, and the metal wire 34 will be omitted since it is like the description for the first embodiment.

The ground 33 is formed by partially removing the corresponding regions of the first and third insulating layers 35 and 39, but its formation position is not limited to the position shown in FIG. 5. To the ground 33, the metal wire 34 is connected. By connecting the metal wire 34 to the ground 33, electric charges generated due to unexpected voltage and/or static electricity applied to the conductive substrate 31 can be discharged to the outside.

Figure 6:
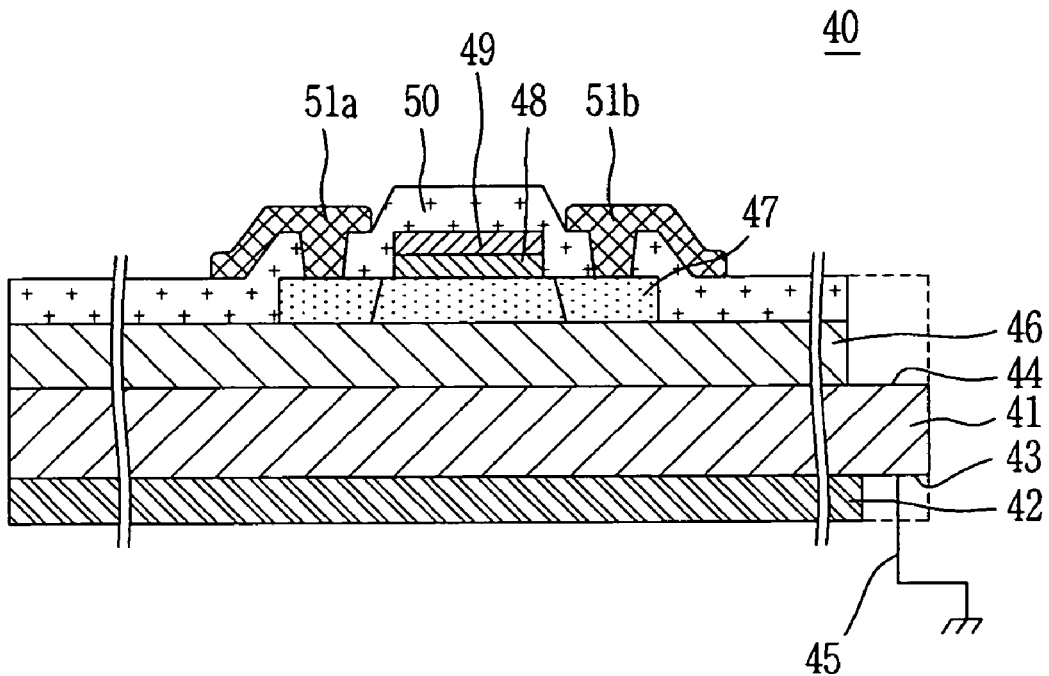
FIG. 6 is a schematic side sectional view illustrating a flat panel display according to a third embodiment of the present invention.

FIG. 6 is a schematic side sectional view illustrating a flat panel display 40 according to a third embodiment of the present invention.

As shown in FIG. 6, the flat panel display 40 includes a conductive substrate 41, a first insulating layer 46, a semiconductor layer 47, a second insulating layer 48, a gate electrode 49, a third insulating layer 50, and source and drain electrodes 51a and 51b. Moreover, the flat panel display 50 further includes a fourth insulating layer 42 formed on the lower surface of the conductive substrate 41, a first ground 43 and a second ground 44 for at least partially grounding the conductive substrate 41, and a metal wire 45.

For the convenience of description, the detailed description of elements like those in the above-described embodiments will be omitted.

In the third embodiment of the present invention, the first and second grounds 43 and 44 are formed by partially removing the corresponding regions of the first, third, and fourth insulating layers 46, 50, and 42 formed on the conductive substrate 41, and the formation positions of the first and second grounds 43 and 44 are not limited to the positions shown in FIG. 6.

To the first ground 43 or to the second ground 44, the metal wire 45 is connected. By connecting the metal wire 45 to the first ground 43 in this embodiment, electric charges, generated due to unexpected voltage or static electricity applied to the conductive substrate 41, can be discharged to the outside. In this embodiment, the metal wire 45 is shown to be connected to the first ground 43, but the metal wire 45 may also be connected to the second ground 44.

Figure 7:
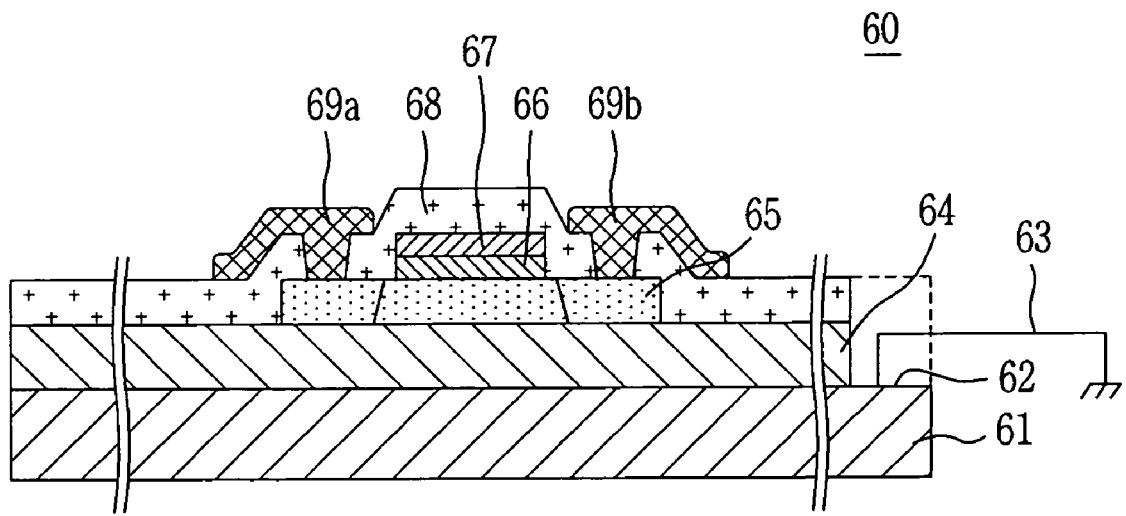
FIG. 7 is a schematic side sectional view illustrating a flat panel display according to a fourth embodiment of the present invention.

FIG. 7 is a schematic side sectional view illustrating a flat panel display 60 according to a fourth embodiment of the present invention.

As shown in FIG. 7, the flat panel display 60 includes a conductive substrate 61, a first insulating layer 64, a semiconductor layer 65, a second insulating layer 66, a gate electrode 67, a third insulating layer 68, and source and drain electrodes 69a and 69b. Moreover, the flat panel display 60 further includes a ground 62 for at least partially grounding the conductive substrate 61, and a metal wire 63. For the convenience of description, the detailed description of elements like those in the above-described embodiments will be omitted.

In the fourth embodiment of the present invention, the ground 62 is formed by partially removing the corresponding regions of the first and third insulating layers 64 and 68 formed on the conductive substrate 61, but its formation position is not limited to the position shown in FIG. 7.

To the ground 62, the metal wire 63 is connected. By connecting the metal wire 63 to the ground 62, electric charges, generated due to unexpected voltage or static electricity applied to the conductive substrate 61, can be discharged to the outside.

Figure 8:
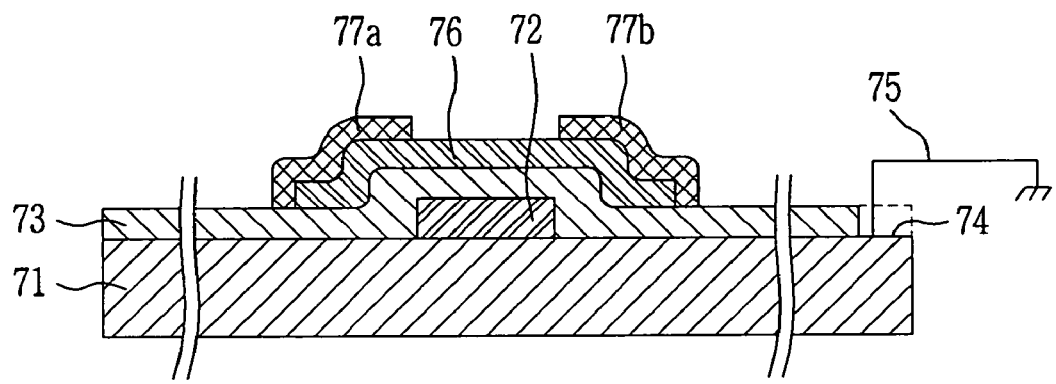
FIG. 8 is a schematic side sectional view illustrating a flat panel display according to a fifth embodiment of the present invention.

As shown in FIG. 8, a flat panel display 70 includes a conductive substrate 71, a gate electrode 72, a gate insulating layer 73, a semiconductor layer 76, and source and drain electrodes 77a and 77b. Moreover, the flat panel display 70 further includes a ground 74 for at least partially grounding the conductive substrate 71, and a metal wire 75. For the convenience of description, the detailed description of elements like those in the above-described embodiments will be omitted.

In FIG. 8, the gate electrode 72 is formed on the conductive substrate 71. On the gate electrode 72 and the conductive substrate 71, the gate insulating layer 73 is formed, and on the gate insulating layer 73, the semiconductor layer 76 is formed such that the gate electrode 72 is positioned at a center region of the semiconductor layer 76. On the semiconductor layer 76, the source and drain electrodes 77a and 77b are formed in the regions except for the center region corresponding to the gate electrode 72.

The ground 74 is formed by partially removing a region of the gate insulating layer 73 formed on the conductive substrate 71, but its formation position is not limited to the position shown in FIG. 8.

To the ground 74, the metal wire 75 is connected. By connecting the metal wire 75 to the ground 74, electric charges, generated due to unexpected voltage or static electricity applied to the conductive substrate 71, can be discharged to the outside.

Figure 9:
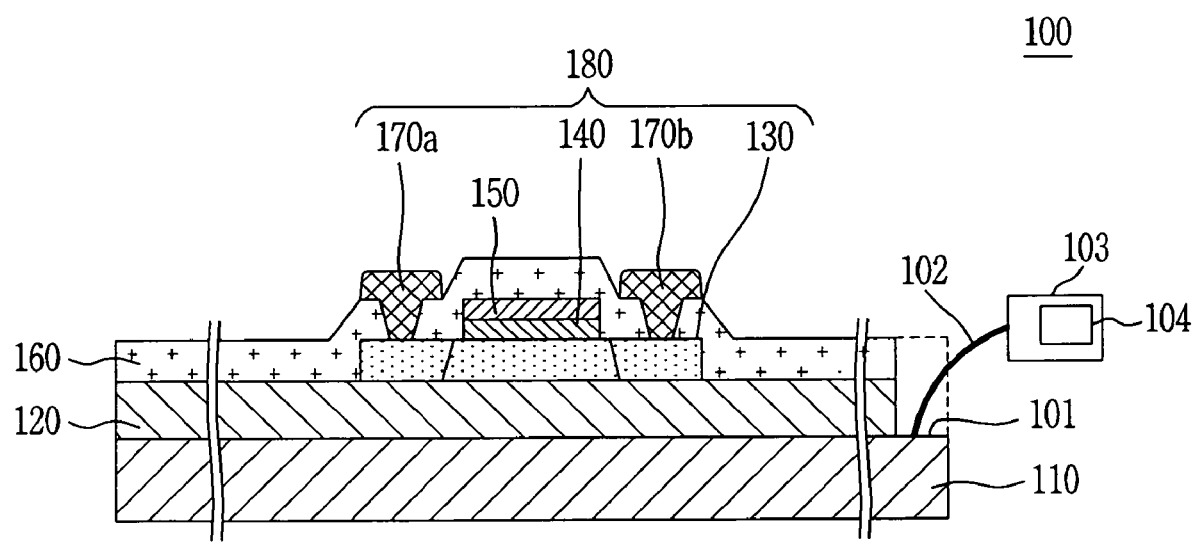
FIG. 9 is a schematic side sectional view illustrating a flat panel display according to a sixth embodiment of the present invention.

FIG. 9 is a schematic side sectional view illustrating a flat panel display 100 according to a sixth embodiment of another aspect of the present invention.

As shown in FIG. 9, the flat panel display 100 includes a thin film transistor 180, a substrate exposing part 101, a first insulating layer 120, a second insulating layer 140, a third insulating layer 160, a system controller 103, and a voltage controller 104. The thin film transistor 180 is formed on the conductive substrate 110 and includes a semiconductor layer 130, a gate electrode 150, and source and drain electrodes 170a and 170b.

The substrate exposing part 101 is formed by removing corresponding regions of the first and third insulating layers 120 and 160 to partially expose the conductive substrate 110.

The system controller 103 is formed to apply back bias voltage to the conductive substrate 110, and a connection wire 102 is formed between the system controller 103 and the substrate exposing part 101 such that the system controller 103 is electrically connected to the substrate exposing part 101.

In more detail, the first insulating layer 120 of the thin film transistor 180 is formed on the conductive substrate 110, and serves as a buffer layer. The conductive substrate 110 is made of stainless steel (SUS) or titanium (Ti), and, in one embodiment, is formed of a flexible metal foil.

The semiconductor layer 130 is formed on the first insulating layer 120, and the semiconductor layer 130 uses low temperature polysilicon (LTPS) in which amorphous silicon vapor deposited on the conductive substrate 100 is crystallized by laser. The semiconductor layer 130 may be made of silicon and/or organic material. On the semiconductor layer 130, the second insulating layer 140 is formed, and on the second insulating layer 140, the gate electrode 150 is formed. In this embodiment, the second insulating layer 140 and the gate electrode 150 may be simultaneously patterned, and as shown in FIG. 9, the gate electrode 150 and the second insulating layer 140 may be formed in the channel region of the semiconductor layer 130.

The third insulating layer 160 is formed on the first insulating layer 120 and the gate electrode 150, and on the third insulating layer 160, a plurality of contact holes is formed. The source and drain electrodes 170a and 170b are formed on the third insulating layer 160, and electrically connected to the semiconductor layer 130 via the contact holes formed in the third insulating layer 160. The first to third insulating layers 120, 140, and 160 are oxide films or nitride films, but are not limited to them.

The substrate exposing part 101 is formed by removing corresponding regions of the first and third insulating layers 120 and 160 to partially expose the conductive substrate 110, but its formation position is not limited to the position shown in FIG. 9.

On the conductive substrate 110, the system controller 103, connected to the substrate exposing part 101, is formed. The system controller 103 applies negative back bias voltage when the thin film transistor 180 formed on the conductive substrate 110 is a PMOS-type thin film transistor, and applies positive back bias voltage when the thin film transistor 180 is an NMOS-type thin film transistor 180. The system controller 103 includes a voltage controller 104 for controlling the back bias voltage applied to the conductive substrate 110. The voltage controller 104 can control the back bias voltage applied to the conductive substrate 110, particularly, negative back bias voltage in a case of the PMOS thin film transistor 180, and positive back bias voltage in a case of the NMOS thin film transistor 180 so that the voltage controller 104 can control characteristics of the thin film transistor 180 due to stress generated when external force is applied to the conductive substrate 110. In more detail, the voltage controller 104 can control mobility, leakage current, threshold voltage, and S-slope of the thin film transistor 180.

Between the substrate exposing part 101 and the system controller 103, the connection wire 102 for electrically connecting the substrate exposing part 101 to the system controller 103 is formed. The connection wire 102 connects the substrate exposing part 101 to the system controller 103 in various connection methods (for example, by soldering). Moreover, the connection wire 102 has a strap shape having a predetermined width or a line shape, but is not limited to these shapes.

Figure 10:
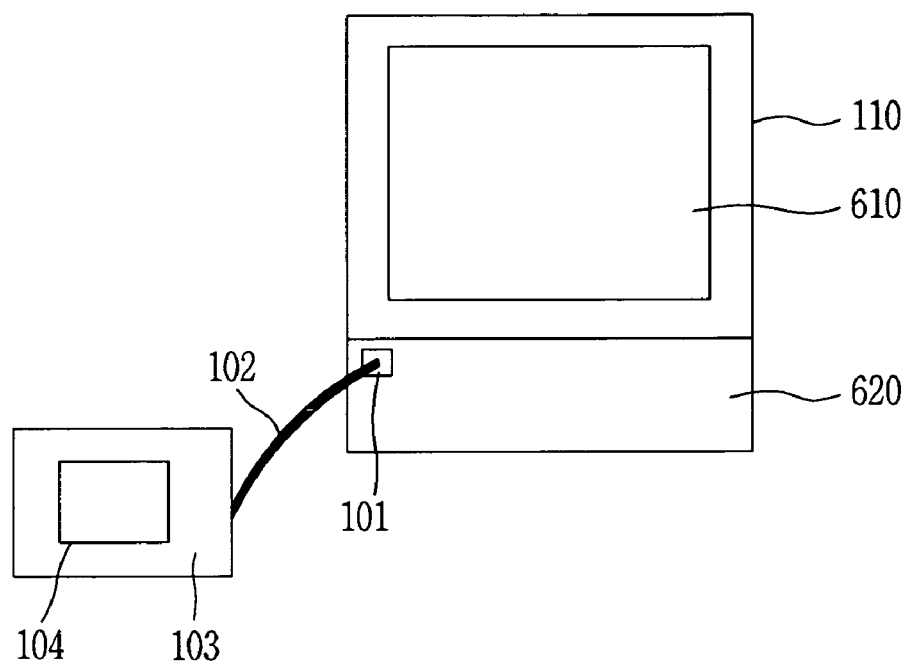
FIG. 10 is a schematic plan view of an organic light emitting display illustrating a position connected to a system controller of FIG. 9.
Figure 11:
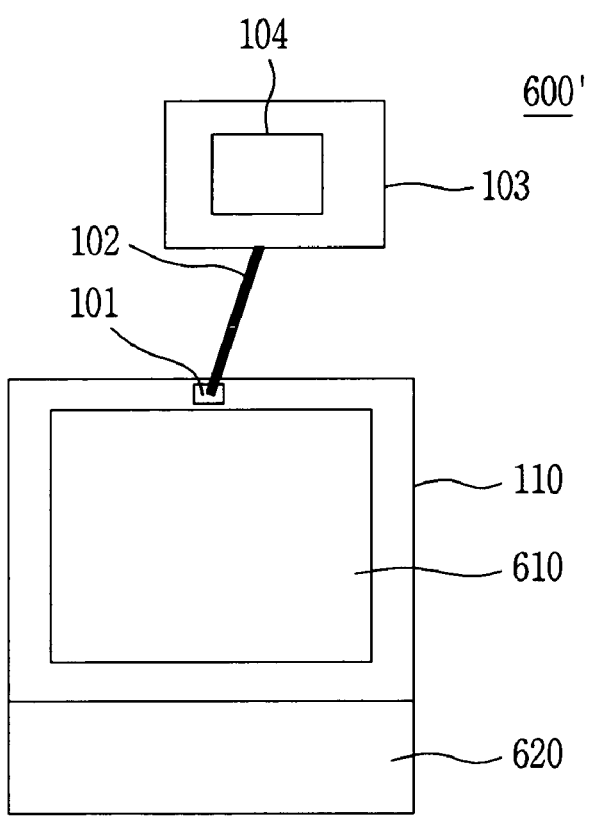
FIG. 11 is a schematic plan view of another organic light emitting display illustrating a position connected to the system controller of FIG. 9.

FIG. 10 is a schematic plan view of an organic light emitting display 600 illustrating a position connected to the system controller 103 of FIG. 9, and FIG. 11 is a schematic plan view of another organic light emitting display 600' illustrating a position connected to the system controller 103 of FIG. 9.

As shown in FIGS. 10 and 11, the flat panel display 600 or 600' includes an image displaying region 610 and a pad 620 formed on the conductive substrate 110, the substrate exposing part 101, the system controller 103, the voltage controller 104, and the connection wire 102. In the image displaying region 610, thin film transistors (not shown) and light emitting devices (not shown) are formed, and in the pad 620, terminals (not shown) are formed. In one embodiment, at least one of the light emitting devices is an organic light emitting device. For the convenience of description, the detailed description of the thin film transistors and organic light emitting devices is omitted.

As shown in FIG. 10, the system controller 103, connected to the substrate exposing part 101, is formed in a corner of the conductive substrate 110. The system controller 103 applies negative back bias voltage when the thin film transistor (e.g., the thin film transistor 180 of FIG. 9) formed on the conductive substrate 110 is a PMOS-type thin film transistor, and applies positive back bias voltage when the thin film transistor is an NMOS-type thin film transistor. The formation position of the substrate exposing part 103 is not limited to the position shown in FIG. 10. The system controller 103 includes the voltage controller 104 for controlling the back bias voltage applied to the conductive substrate 110. The voltage controller 104 can control the back bias voltage applied to the conductive substrate 110, particularly, negative back bias voltage in a case of the PMOS thin film transistor, and positive back bias voltage in a case of the NMOS thin film transistor so that the voltage controller 104 can control characteristics of the thin film transistor due to stress generated when bending the conductive substrate 110. Between the substrate exposing part 101 and the system controller 103, the connection wire 102 for electrically connecting the substrate exposing part 101 to the system controller 103 is formed.

As shown in FIG. 11, the system controller 103 is formed in a central region of an end the conductive substrate 110, and in more detail, in the upper central region of the image displaying region 610. Like the above description for the embodiment of FIG. 10, the system controller 103 connected to the substrate exposing part 101 and the connection wire 102 for electrically connecting the system controller 103 to the substrate exposing part 101 are formed. The system controller 103 includes the voltage controller 104 for controlling the back bias voltage applied to the conductive substrate 110, particularly, negative back bias voltage in a case of the PMOS thin film transistor, and positive back bias voltage in a case of the NMOS thin film transistor. The voltage controller 104 can control characteristics of the thin film transistor (not shown) due to stress generated when external force is applied to the conductive substrate 110.

Although, in the above embodiment, the system controller 103 is formed in the corner of the conductive substrate 110 or in the central region of an end, the position where the system controller 103 is formed is not limited to this, but the system controller 103 should be formed in the position where light emission efficiency of the organic light emitting devices formed in the image displaying region 610 is not deteriorated.

Figure 12:
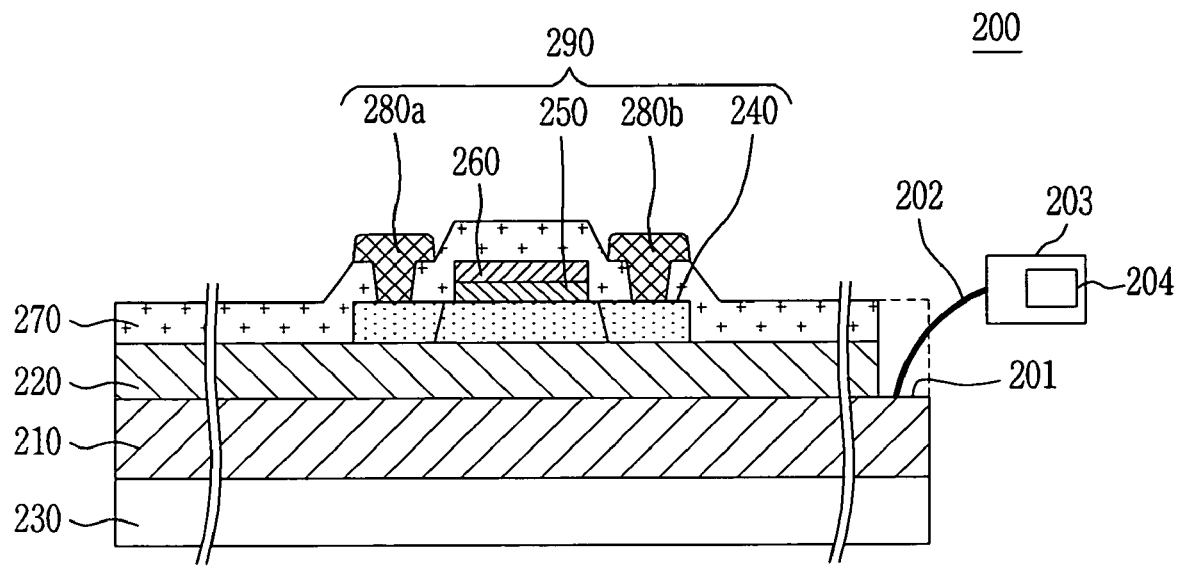
FIG. 12 is a schematic side sectional view illustrating a flat panel display according to a seventh embodiment of the present invention.

FIG. 12 is a schematic side sectional view illustrating a flat panel display 200 according to a seventh embodiment of the present invention.

As shown in FIG. 12, the flat panel display 200 includes a thin film transistor 290, a substrate exposing part 201, a first insulating layer 220, a second insulating layer 250, a third insulating layer 270, a fourth insulating layer 230, a system controller 203, and a voltage controller 204.

The thin film transistor 290 is formed on the conductive substrate 210 and includes a semiconductor layer 240, a gate electrode 260, and source and drain electrodes 280a and 280b. Moreover, the thin film transistor 290 further includes the fourth insulating layer 230 formed on the lower surface of the conductive substrate 210 and a connection wire 202. The fourth insulating layer 230 is formed on the lower surface of the conductive substrate 210 and substantially prevents exterior noises and impurities from entering the conductive substrate 210.

To avoid duplicate description, the detailed description of the first insulating layer 220, the semiconductor layer 240, the second insulating layer 250, the gate electrode 260, the third insulating layer 270, the source and drain electrodes 280a and 280b, and the connection wire 202 will be omitted since it is like the description of the sixth embodiment.

The substrate exposing part 201 is formed by removing corresponding regions of the first and third insulating layers 220 and 270 to partially expose the conductive substrate 210, but its formation position is not limited to the position shown in FIG. 12.

On the conductive substrate 210, the system controller 203, connected to the substrate exposing part 201, is formed. The system controller 203 applies negative back bias voltage when the thin film transistor 290 formed on the conductive substrate 210 is a PMOS-type thin film transistor, and applies positive back bias voltage when the thin film transistor 290 is an NMOS-type thin film transistor 290. The system controller 203 includes the voltage controller 204 for controlling the back bias voltage applied to the conductive substrate 210. The voltage controller 204 can control the back bias voltage applied to the conductive substrate 210, particularly, negative back bias voltage in a case of the PMOS thin film transistor 290, and positive back bias voltage in a case of the NMOS thin film transistor 290 so that the voltage controller 204 can control characteristics of the thin film transistor 290 due to stress generated when external force is applied to the conductive substrate 210. In more detail, the voltage controller 204 can control mobility, leakage current, threshold voltage, and S-slope of the thin film transistor 290.

Moreover, between the substrate exposing part 201 and the system controller 203, the connection wire 202 for electrically connecting the substrate exposing part 201 to the system controller 203 is formed.

Figure 13:
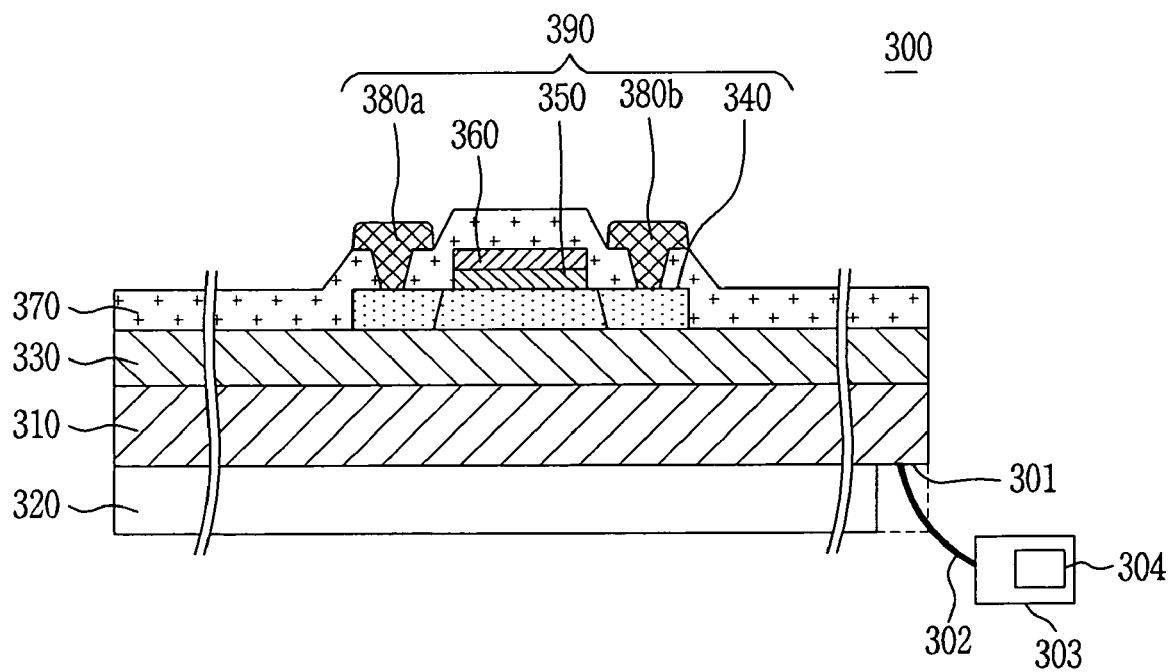
FIG. 13 is a schematic side sectional view illustrating a flat panel display according to an eighth embodiment of the present invention.

FIG. 13 is a schematic side sectional view illustrating a flat panel display 300 according to an eighth embodiment of the present invention.

As shown in FIG. 13, the flat panel display 300 includes a thin film transistor 390, a substrate exposing part 301, a first insulating layer 330, a second insulating layer 350, a third insulating layer 370, a fourth insulating layer 320, a system controller 303, and a voltage controller 304.

The thin film transistor 390 is formed on the conductive substrate 310 and includes a semiconductor layer 340, a gate electrode 360, and source and drain electrodes 380a and 380b. Moreover, the thin film transistor 390 further includes the fourth insulating layer 320 formed on the lower surface of the conductive substrate 310 and a connection wire 302.

For the convenience of description, the detailed description of elements like those in the above-described embodiments will be omitted.

The substrate exposing part 301 is formed by removing a region of the fourth insulating layers 320 to partially expose the conductive substrate 310, but its formation position is not limited to the position shown in FIG. 13.

Meanwhile, on the conductive substrate 310, the system controller 303, connected to the substrate exposing part 301, is formed. The system controller 303 applies negative back bias voltage when the thin film transistor 390 formed on the conductive substrate 310 is a PMOS-type thin film transistor, and applies positive back bias voltage when the thin film transistor 390 is an NMOS-type thin film transistor 390. The system controller 303 includes a voltage controller 304 for controlling the back bias voltage applied to the conductive substrate 310. The voltage controller 304 can control the back bias voltage applied to the conductive substrate 310, particularly, negative back bias voltage in a case of the PMOS thin film transistor 390, and positive back bias voltage in a case of the NMOS thin film transistor 390 so that the controller 304 can control characteristics of the thin film transistor 390 due to stress generated when external force is applied to the conductive substrate 310. In more detail, the voltage controller 304 can control mobility, leakage current, threshold voltage, and S-slope of the thin film transistor 390.

Moreover, between the substrate exposing part 301 and the system controller 303, the connection wire 302 for electrically connecting the substrate exposing part 301 to the system controller 303 is formed.

Figure 14:
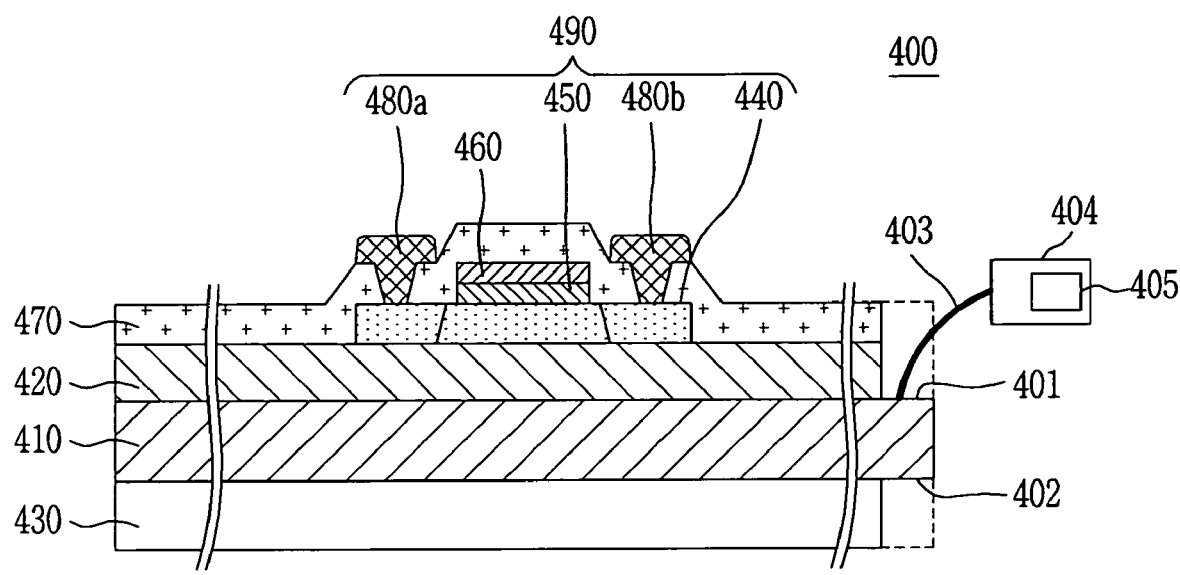
FIG. 14 is a schematic side sectional view illustrating a flat panel display according to a ninth embodiment of the present invention.

FIG. 14 is a schematic side sectional view illustrating a flat panel display 400 according to a ninth embodiment of another aspect of the present invention.

As shown in FIG. 14, the flat panel display 400 includes a thin film transistor 490, a first substrate exposing part 401, a second substrate exposing part 402, a first insulating layer 420, a second insulating layer 450, a third insulating layer 470, a system controller 404, and a voltage controller 405.

The thin film transistor 490 is formed on a flexible conductive substrate 410 and includes a semiconductor layer 440, a gate electrode 460, and source and drain electrodes 480a and 480b. Moreover, the thin film transistor 490 further includes the fourth insulating layer 430 formed on the lower surface of the flexible conductive substrate 410 and a connection wire 403.

For the convenience of description, the detailed description of elements like those in the above-described embodiments will be omitted.

The first substrate exposing part 401 and the second substrate exposing part 402 are formed by removing corresponding regions of the first, third, and fourth insulating layers 420, 470, and 430 to partially expose the conductive substrate 410, but their formation positions are not limited to those shown in FIG. 14.

Meanwhile, on the conductive substrate 410, the system controller 404, connected to the substrate exposing part 401, is formed. The system controller 404 applies negative back bias voltage when the thin film transistor 490 formed on the conductive substrate 410 is a PMOS-type thin film transistor, and applies positive back bias voltage when the thin film transistor 490 is an NMOS-type thin film transistor 490. The system controller 404 includes the voltage controller 405 for controlling the back bias voltage applied to the conductive substrate 410. The voltage controller 405 can control the back bias voltage applied to the conductive substrate 410, particularly, negative back bias voltage in a case of the PMOS thin film transistor 490, and positive back bias voltage in a case of the NMOS thin film transistor 490 so that the voltage controller 405 can control characteristics of the thin film transistor 490 due to stress generated when external force is applied to the conductive substrate 410. In more detail, the voltage controller 405 can control mobility, leakage current, threshold voltage, and S-slope of the thin film transistor 490.

Moreover, between the substrate exposing part 401 and the system controller 404, the connection wire 403 for electrically connecting the substrate exposing part 401 to the system controller 404 is formed.

Although the connection wire 403 is shown to be formed in the first substrate exposing part 401, the connection wire 403 may also be connected to the second substrate exposing part 402.

Figure 15:
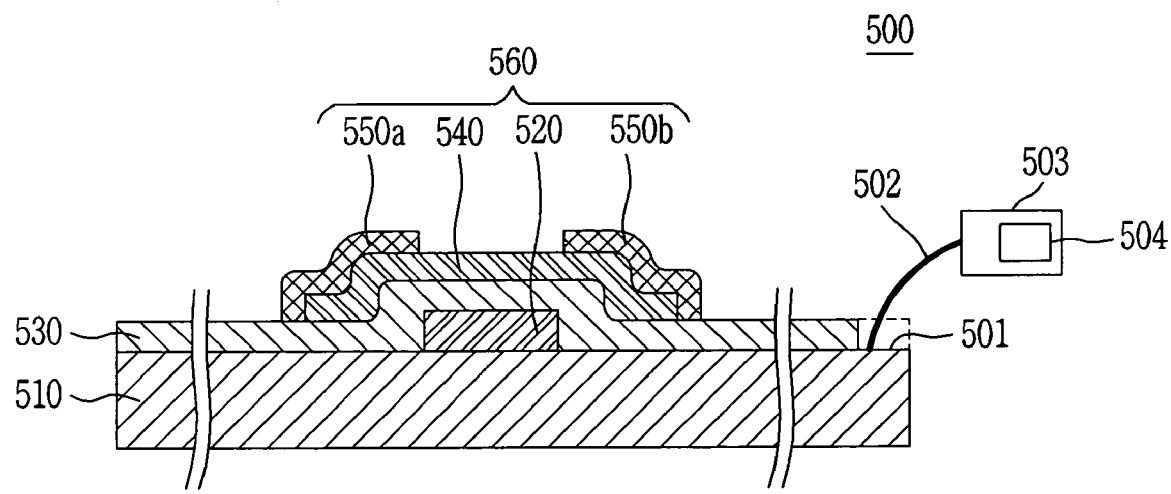
FIG. 15 is a schematic side sectional view illustrating a flat panel display according to a tenth embodiment of the present invention.

FIG. 15 is a schematic side sectional view illustrating a flat panel display 500 according to a tenth embodiment of the present invention.

As shown in FIG. 15, the flat panel display 500 includes a thin film transistor 560, a system controller 503, and a voltage controller 504. The thin film transistor 560 includes a gate electrode 520, and source and drain electrodes 550a and 550b. Moreover, the thin film transistor 560 further includes a connection wire 502 formed on the conductive substrate 510.

To avoid duplicate description, the detailed description of the gate electrode 520, the semiconductor layer 540, the source and drain electrodes 550a and 550b, and the connection wire 502 will be omitted since it is like the description of the ninth embodiment.

The substrate exposing part 501 is formed by removing a region of a gate insulating layer 530 to partially expose the conductive substrate 510, but its formation position is not limited to the position shown in FIG. 15.

On the conductive substrate 510, the system controller 503, connected to the substrate exposing part 501, is formed. The system controller 503 applies negative back bias voltage when the thin film transistor 560 formed on the conductive substrate 510 is a PMOS-type thin film transistor, and applies positive back bias voltage when the thin film transistor 560 is an NMOS-type thin film transistor 560. The system controller 503 includes the voltage controller 504 for controlling the back bias voltage applied to the conductive substrate 510. The voltage controller 504 can control the back bias voltage applied to the conductive substrate 510, particularly, negative back bias voltage in a case of the PMOS thin film transistor 560, and positive back bias voltage in a case of the NMOS thin film transistor 560 so that the voltage controller 504 can control characteristics of the thin film transistor 560 due to stress generated when external force is applied to the conductive substrate 510. In more detail, the voltage controller 504 can control mobility, leakage current, threshold voltage, and S-slope of the thin film transistor 560.

Moreover, between the substrate exposing part 501 and the system controller 503, the connection wire 502 for electrically connecting the substrate exposing part 501 to the system controller 503 is formed.

Figure 16:
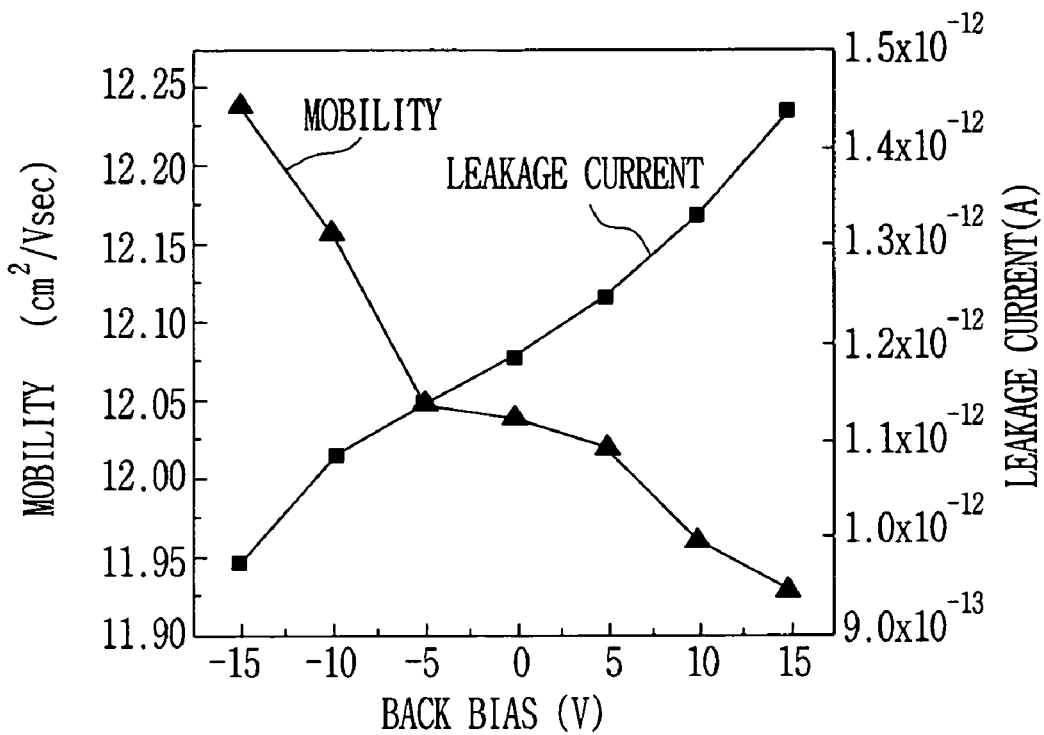
FIGS. 16 and 17 illustrate characteristics of a thin film transistor according to embodiments of the present invention.
Figure 17:
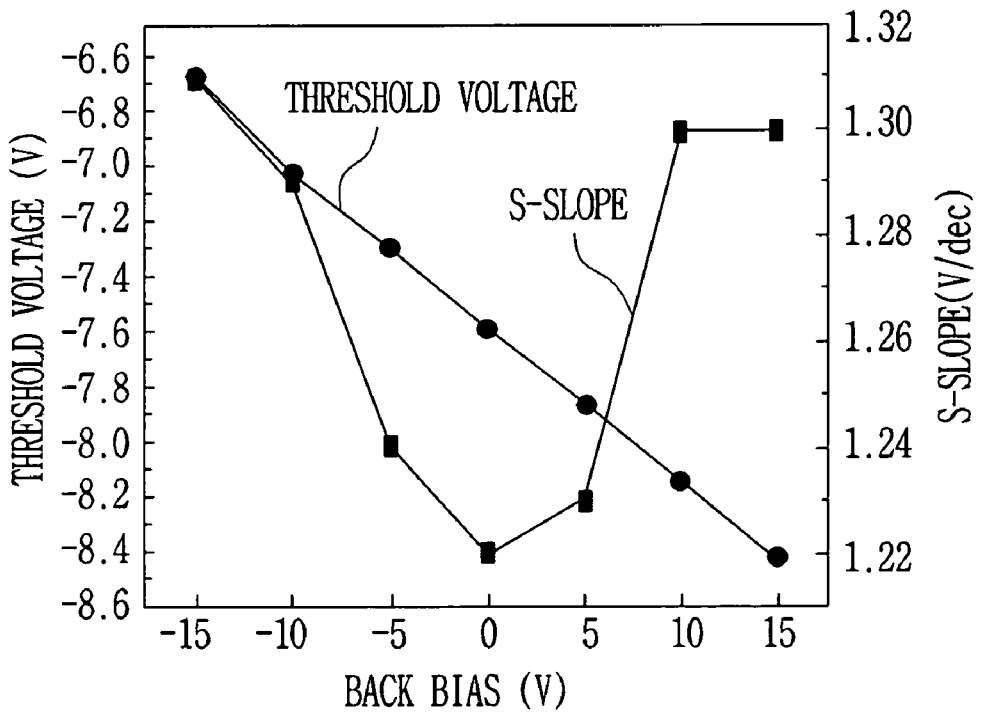

FIGS. 16 and 17 are graphs illustrating the characteristics of a thin film transistor according to embodiments of the present invention.

In FIG. 16, the X-axis represents back-bias voltage applied to a conductive substrate, and the Y-axis represents mobility and leakage current of a PMOS type low temperature polysilicon thin film transistor formed on a conductive substrate. As illustrated in FIG. 16, when positive back bias voltage is applied to the conductive substrate, leakage current of the thin film transistor is increased and mobility of the thin film transistor is decreased so that characteristics of the thin film transistor are deteriorated. In contrast, when negative back bias voltage is applied to the conductive substrate, leakage current of the thin film transistor is decreased and mobility of the thin film transistor is increased, characteristics of the thin film transistor are improved.

For example, when back bias voltage of $-10V$ is applied to the conductive substrate, the leakage current is $1.1 \times 10^{-12}$ A, and the mobility is 12.15 cm$^2$/Vsec. In comparison, when back bias voltage of 10V is applied to the conductive substrate, the leakage current is $1.35 \times 10^{-12}$ A, and the mobility is 11.95 cm$^2$/Vsec. Moreover, when back bias voltage of $-15V$ to the conductive substrate, the leakage current is $1.0 \times 10^{-12}$ A, and the mobility is 12.25 cm$^2$/Vsec.

According to the results of the experimentation, in a case of the PMOS-type thin film transistor, when negative back bias voltage is applied to the conductive substrate, in comparison to when positive back bias voltage is applied to the conductive substrate, driving characteristics of the thin film transistor are better in view of leakage current and mobility; and particularly when negative back bias voltage is increased, the driving characteristics of the thin film transistor are improved even more.

In FIG. 17, the X-axis represents back-bias voltage applied to a conductive substrate, and the Y-axis represents threshold voltage and S-slope of a PMOS-type low temperature polysilicon thin film transistor formed on the conductive substrate. As illustrated in this graph, when positive back bias voltage is applied to the conductive substrate, threshold voltage of the thin film transistor is decreased so that the driving characteristics of the thin film transistor are deteriorated. In comparison, when negative back bias voltage is applied to the conductive substrate, the threshold voltage of the thin film transistor is increased. Moreover, when the absolute value of back bias voltage is large, the S-slope is increased.

For example, when back bias voltage of $-10V$ is applied to the conductive substrate, the threshold voltage is $-7.0$ V. In comparison, when back bias voltage of 10V is applied to the conductive substrate, the threshold voltage is $-8.2$ V.

Moreover, when back bias voltage of $-5V$ is applied to the conductive substrate, the S-slope is 1.24 V/dec. In comparison, when back bias voltage of 15V is applied to the conductive substrate, the S-slope is 1.30 V/dec.

According to the results of the experimentation, in a case of the PMOS type thin film transistor, when positive back bias voltage is applied to the conductive substrate in comparison to when negative back bias voltage is applied to the conductive substrate, driving characteristics of the thin film transistor with respect to threshold voltage are improved. Moreover, when applying back bias voltage having a large absolute value to the conductive substrate, in comparison to when applying back bias voltage having a small back bias voltage to the conductive substrate, driving characteristics of the thin film transistor with respect to S-slope are improved.

In the above-mentioned embodiment, although the case of applying positive back bias voltage to the conductive substrate in the PMOS-type thin film transistor is described in detail, negative back bias voltage can also be applied to the conductive substrate in the NMOS type thin film transistor.

As described above, according to the present invention, a metal wire is formed on a ground exposing region of a conductive substrate, so that a thin film transistor is prevented from deteriorating due to external force accidentally applied to a conductive substrate and threshold voltage, and from changing due to voltage, static electricity, or the like, accidentally applied to the conductive substrate. Thus, in an organic light emitting display, color coordinates, gray scale, and contrast are substantially prevented from being changed, thereby enhancing the emission efficiency of a light emitting diode.

Further, a system controller is connected to a substrate exposing part of a conductive substrate, so that negative back bias voltage is applied when the thin film transistor formed on the conductive substrate is PMOS type thin film transistor, and positive back bias voltage is applied when the thin film transistor is NMOS-type thin film transistor.

Thus, mobility, leakage current, brightness, contrast or the like of light emitting diode are improved, thereby enhancing the performance of a display. While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A method for controlling a characteristic of a flat panel display, the method comprising:
   preparing a conductive substrate;
   after the preparing of the conductive substrate, forming a first insulating layer comprising at least one insulating layer, and a thin film transistor on a first surface of the prepared conductive substrate;

after the preparing of the conductive substrate, forming a second insulating layer on a second surface of the prepared conductive substrate;

forming a light emitting device on the thin film transistor and electrically connected to the thin film transistor;

removing a region of at least one of the first insulating layer or the second insulating layer formed on the conductive substrate to form a bias voltage contact; and back biasing the conductive substrate through the bias voltage contact.

2. The method as claimed in claim 1, wherein the bias voltage contact is a ground contact to ground the conductive substrate.

3. The method as claimed in claim 1, wherein the forming of the second insulating layer on the second surface of the prepared conductive substrate comprises forming at least one nitride film on the second surface of the prepared conductive substrate.

4. The method as claimed in claim 1, further comprising substantially preventing noise and impurities from entering the conductive substrate by selecting a material composition of the second insulating layer formed on the second surface of the prepared conductive substrate.

5. The method as claimed in claim 4, wherein the preventing of the noise and impurities from entering the conductive substrate comprises forming at least one nitride film as at least a portion of the second insulating layer on the second surface of the prepared conductive substrate.

6. The method as claimed in claim 1, wherein the forming of the light emitting device comprises forming an organic light emitting device.

7. A method for controlling a characteristic of a flat panel display, the method comprising:

preparing a conductive substrate;

forming a first insulating layer comprising at least one insulating layer, and a thin film transistor on a first surface of the prepared conductive substrate;

forming a second insulating layer on a second surface of the prepared conductive substrate;

forming a light emitting device on the thin film transistor and electrically connected to the thin film transistor;

removing a region of at least one of the first insulating layer or the second insulating layer formed on the conductive substrate to form a bias voltage contact; and back biasing the conductive substrate through the bias voltage contact, wherein the conductive substrate comprises stainless steel, metal foil or titanium.

8. A method for controlling a characteristic of a flat panel display, the method comprising:

preparing a conductive substrate;

forming a first insulating layer comprising at least one insulating layer, and a thin film transistor on a first surface of the prepared conductive substrate;

forming a second insulating layer on a second surface of the prepared conductive substrate;

forming a light emitting device on the thin film transistor and electrically connected to the thin film transistor;

removing a region of at least one of the first insulating layer or the second insulating layer formed on the conductive substrate to form a bias voltage contact;

back biasing the conductive substrate through the bias voltage contact; and forming a third insulating layer on the first insulating layer, wherein removing a region of the least one of the first insulating layer or the second insulating layer comprises removing a region of the first insulating layer and the third insulating layer.

* * * * *